US006002262A

United States Patent [19]

Higashi et al.

[11] Patent Number: 6,002,262

[45] Date of Patent: *Dec. 14, 1999

[54] METHOD OF AND APPARATUS FOR MEASURING FLATNESS OF SEMICONDUCTOR WAFERS THAT HAVE NOT BEEN SUBJECTED TO DONOR-KILLER TREATMENT

[75] Inventors: Junichiro Higashi, Ohmura, Japan; Robert K. Graupner, Santa Clara, Calif.

[73] Assignee: Komatsu Electronic Metals Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/684,149

[22] Filed: Jul. 19, 1996

[51] Int. Cl.[6] .................................................... G01N 27/22

[52] U.S. Cl. ............................................ 324/671; 324/765

[58] Field of Search .................................... 324/671, 765, 324/662, 767; 250/341.4, 341.1; 364/562; 702/158, 166, 170

[56] References Cited

U.S. PATENT DOCUMENTS

| | | | |
|---|---|---|---|
| 4,758,786 | 7/1988 | Hafeman | 324/767 |
| 4,827,212 | 5/1989 | Kamieniecki | 324/765 |

*Primary Examiner*—Michael Brock
*Attorney, Agent, or Firm*—Welsh & Katz, Ltd.

[57] ABSTRACT

A halogen lamp of illuminance 150,000 lux or greater and wavelength 1129 nm or less is provided in the vicinity of a probe of an electrostatic capacitative flatness measuring instrument, and illuminates the surface of the wafer under measurement. When the light enters into the bulk, it is converted to excitation energy, which converts the valence electrons of the silicon into conduction electrons. Since the free electrons or positive holes generated from the silicon are overwhelmingly more than the dopant or oxygen donors, the wafer exhibits characteristics similar to metal. That is, electrons are uniformly distributed in all parts of the wafer. When, in this state, the upper face and lower face of the wafer are measured, the relative dielectric constant is fixed in all locations, so all the changes in electrical amount can be measured as changes in distance between the wafer and the probe. Thus, the accurate flatness measurement for semiconductor wafers that have not been subjected to donor-killer treatment can be achieved by using an electrostatic capacitative flatness measuring instrument.

2 Claims, 5 Drawing Sheets

(PRIOR ART)

METHOD OF AND APPARATUS FOR MEASURING FLATNESS OF SEMICONDUCTOR WAFERS THAT HAVE NOT BEEN SUBJECTED TO DONOR-KILLER TREATMENT

BACKGROUND OF THE INVENTION

1. Field of the Invention

The present invention relates to a method of and apparatus for measuring the flatness of wafers that have not been subjected to donor-killer treatment.

2. Description of the Related Art

For the substrates of semiconductor devices, high-purity silicon single crystals are chiefly employed. One method of manufacturing such silicon single crystals is the Czochralski method (hereinbelow called the CZ method). In the CZ method, polycrystalline silicon is packed into a quartz crucible arranged in a chamber of a semiconductor single crystal manufacturing apparatus and the polycrystalline silicon is melted by heating it by means of a heater provided at the circumference of the quartz crucible, to form a molten liquid. A seed crystal mounted on a seed chuck is then dipped into this molten liquid, and the silicon single crystal is grown by raising the seed chuck while rotating the seed chuck and quartz crucible in the same or opposite directions. In this process, oxygen dissolves into the molten liquid due to reaction between the quartz crucible and the molten liquid, so the silicon single crystal that is pulled up contains about $10^{18}$ atm/$cm^3$ of oxygen. This oxygen is present interstitially, so, on cooling the single crystal, oxygen donors are generated.

The oxygen donors are removed from the silicon single crystalline ingot by heat treatment after the slicing and grinding steps. After passing through these steps, the thickness and flatness of the wafer are measured.

When the flatness of donor-killer untreated wafers, that is, wafers that have not been subjected to donor-killer treatment, is measured using an electrostatic capacitance-type flatness measurement instrument, erroneous measurement, in which good products are identified as rejects, occur in a proportion of a few percent to a few tens of percent per lot. The reason for this is thought to be that, when the flatness is calculated using the detected values of wafer thickness, these detected values are in fact thicker or thinner than the actual wafer thickness, due to the presence of the interstitial oxygen in a donor-killer untreated wafer acting as a donor, the interstitial oxygen being distributed in irregular fashion. When an electrostatic capacitative flatness measurement instrument is employed, if the electrical resistance is different even for wafers of the same thickness, their thickness will be indicated as thicker or thinner than the true thickness. As an example, when two wafers of different electrical resistance but confirmed to be of the same thickness by a measuring instrument such as an electronic micrometer are measured using an electrostatic capacitative flatness measuring instrument, it is found that the wafer with the higher electrical resistance is indicated as being thinner than the wafer with the lower electrical resistance.

FIG. 4 shows a p-type as-grown wafer 4 in which the interstitial oxygen concentration is highly uneven such that the wafer 4 has portions H of higher electrical resistance (electrically neutral) and portions L of lower electrical resistance. In such a wafer, even if the thickness of the wafer is in fact uniform, it will erroneously be measured as thicker or thinner depending on the electrical resistance as shown in FIG. 5. Accordingly, precise flatness data cannot be obtained before the wafer has been subjected to donor-killer treatment. However, if reject products, whose flatness does not meet the required standard, are only picked out after they have been subjected to donor-killer treatment, this donor-killer treatment is a wasted step for the rejected products. Also, if wafers whose product specification does not require them to be subjected to donor-killer treatment still have to be subjected to donor-killer treatment in order to check their flatness, this likewise represents a wasted step.

SUMMARY OF THE INVENTION

With the foregoing in view, it is an object of the present invention to provide an electrostatic capacitative method of measuring flatness and a flatness measuring apparatus used therefor which is capable of measuring flatness with high accuracy even in respect of donor-killer untreated wafers.

Accordingly, in the present invention measurement of electrostatic capacitance is performed by eliminating the errors of measurement caused by oxygen donor concentration unevenness even in the case of donor-killer untreated wafers, by applying a prescribed amount of energy to the surface of the wafer under measurement so that the valence electrons are excited to the conduction level and go into a free electron state.

According to the present invention, in a method of measuring the flatness of semiconductor wafers that have not been subjected to donor-killer treatment, by using an electrostatic capacitative flatness measuring instrument, electrostatic capacitance is measured by the steps of applying excitation energy of more than the band gap of the semiconductor wafer to the semiconductor wafer; applying high frequency voltage across the semiconductor wafer while the semiconductor is placed in a state in which valence electrons in the semiconductor wafer are excited such as to be converted into free electrons; and measuring value of an electric current flowing through the semiconductor wafer.

Preferably, in a method of measuring the flatness of semiconductor wafers that have not been subjected to donor-killer treatment, the energy of more than the band gap of the semiconductor wafer is applied to the semiconductor wafer by illuminating a face of the semiconductor wafer under measurement with light of prescribed wavelength.

Preferably also, in a method of measuring the flatness of semiconductor wafers that have not been subjected to donor-killer treatment, the energy of the light is generated by a light amount of 150,000 lux or higher.

Further, according to the present invention, a flatness measurement apparatus for semiconductor wafers that have not been subjected to donor-killer treatment by using an electrostatic capacitative flatness measuring instrument, comprises excitation means for applying excitation energy of the band gap of the semiconductor wafer or higher to the semiconductor wafer; and electrostatic capacitance measurement means for measuring the electrostatic capacitance by measuring the value of electric current flowing through the semiconductor wafer by applying high frequency voltage across the semiconductor wafer in a state in which valence electrons of the semiconductor wafer are converted into free electrons by means of the excitation means.

Preferably, in a flatness measurement apparatus for semiconductor wafers that have not been subjected to donor-killer treatment, the electrostatic capacitative flatness measuring instrument comprises a high frequency power source; first and second probes for supplying high frequency current from the high frequency power source to an upper surface and a lower surface of the semiconductor wafer to be measured; detection means for detecting the value of electric current flowing between the probes; calculating means for calculating the thickness of the semiconductor wafer from the value of the electric current detected by the detection means; and excitation means disposed in the vicinity of the probes, for applying excitation energy of more than the band gap of the semiconductor wafer to the semiconductor wafer to excite valence electrons in the semiconductor wafer so as to be converted into free electrons, whereby the flatness measurement is performed in a state in which the valence electrons in the semiconductor wafer are excited so as to be converted into free electrons.

Preferably, the excitation means comprises a light source for supplying light energy of prescribed wavelength.

Preferably also, the excitation means comprises a heat source for supplying prescribed heat energy.

Preferably also, the excitation means comprises means for supplying a prescribed electron beam.

Preferably also, the first and second probes are constructed so as to measure electrostatic capacitance in non-contact state with the semiconductor wafer.

Preferably also, the first and second probes are constructed so as to measure the electrostatic capacitance in contact with the semiconductor wafer.

The causes of erroneous measurement as described above are inferred to be as follows from the nature of the measurement system of an electrostatic capacitative type flatness measurement instrument. Specifically, in an electrostatic capacitative type flatness measuring instrument, the relative dielectric constant $\epsilon$ in the wafer is considered as constant, and the change in high frequency current I is calculated as being accounted for by a change in the distance d between the wafer surface and the sensor electrode of the electrostatic capacitative flatness measuring instrument. This is calculated by means of sensors provided above and below the wafer, the value obtained by subtraction from the distance between the sensors being taken as the thickness of that portion. However, in the case of a wafer whose relative dielectric constant $\epsilon$ is not fixed, in portions of low resistance that approximates to a conductor, the relative dielectric constant $\epsilon$ becomes large so the high frequency current I becomes large, and, with a conventional measurement logic, this is evaluated as the distance d being small. Conversely, when an electrical field is applied to portions which are electrically neutral, the induced polarization is large and the relative dielectric constant $\epsilon$ becomes small, so the amount of electricity Q becomes small and, in accordance with what was described above, the distance d is evaluated as being large. Consequently, portions of low resistance are evaluated as being thicker, while portions of higher resistance are evaluated as being thinner.

In the present invention, a light source of prescribed wavelength is provided in the vicinity of the probes of the electrostatic capacitative flatness measuring instrument, and 150,000 lux or higher of light is directed on to the surface of the wafer under measurement. When the wafer is irradiated with light, the light enters into the bulk of the wafer and is absorbed in a fixed proportion, dependent however on wavelength, before reaching the rear face of the wafer. If Planck's constant is denoted by h and the frequency of oscillation by $\nu$, $h\nu$ changes to excitation energy and, if this excitation energy is large enough to exceed the forbidden bandwidth (band gap) Eg, valence electrons become free electrons.

Since $Eg = 1.1$ eV, 1 eV $= 1.60\times10^{-19}$ J, $h = 6.62676\times10^{-34}$ J·s, if $Eg \le h\nu_1$, then $$1.1\times1.6\times10^{-19} \leqq 6.626176\times10^{-34}\times\nu_1$$

$$\nu_1 \geqq \frac{1.1\times1.6\times10^{-19}}{6.626176\times10^{-34}} = 2.656132\times10^{14}$$

If the wavelength is denoted by $\lambda$ and the speed of light by $c$, $\lambda = c/\nu$, then $$\lambda_1 \leqq \frac{3.0\times10^{8}}{2.656132\times10^{14}}\ \text{(m)} = 1.129\times10^{-6}\ \text{m}$$

In accordance with the above, if the wafer is irradiated with light of wavelength 1129 nm or less, the valence electrons of the silicon become conduction electrons. Since the wavelength of infrared light is from $1.0\times10^{-3}$ to $8.1\times10^{-7}$ m, and the wavelength of visible light is from $8.1\times10^{-7}$ to $3.8\times10^{-7}$ m, sufficient excitation can be achieved from the infrared zone. Therefore, if irradiation is performed with a halogen lamp having a wide wavelength band, the same phenomenon can be inferred to take place within the bulk as at the surface. This measurement is also possible if light of short wavelength that is unable to enter within the bulk is directed onto the upper and lower faces of the wafer.

Referring to FIG. 2, in the case of a p type semiconductor, the dopant (+) and oxygen donor (−) are electrically neutral. However, when irradiated with light, as shown in FIG. 3, many more free electrons or positive holes are generated from the silicon than the dopant or oxygen donor, so a condition similar to that of a metal is produced. That is, electrons are uniformly distributed in all portions of the wafer. If in this condition measurement is performed on the lower surface or upper surface of the wafer using an electrostatic capacitative flatness measuring instrument, since the relative dielectric constant $\epsilon$ is constant at all locations (the density of the conduction electrons emitted from the Si is very high and uniform), all of the change of electrical quantity Q detected by the sensors is accounted for by change of the distance d between the sensor electrode and wafer surface, so the distance d can therefore be measured. However, it should be noted that, since the relative dielectric constant $\epsilon$ is larger than for a semiconductor, d is erroneously evaluated as being smaller, so the wafer thickness is indicated as being thicker than the true thickness. However, if it is the displacement of thickness (degree of flatness) that is being measured, the effect of this is slight and the flatness thus measured is the same as the flatness measured after donor-killer treatment. If in fact a precise measurement of thickness is to be performed, calibration while under irradiation by light is appropriate.

DESCRIPTION OF THE PREFERRED EMBODIMENTS

An embodiment of a flatness measuring method and flatness measuring apparatus according to the present invention for a wafer that has not been subjected to donor-killer treatment (donor-killer untreated wafer) is described below with reference to the accompanying drawings.

Figure 1:
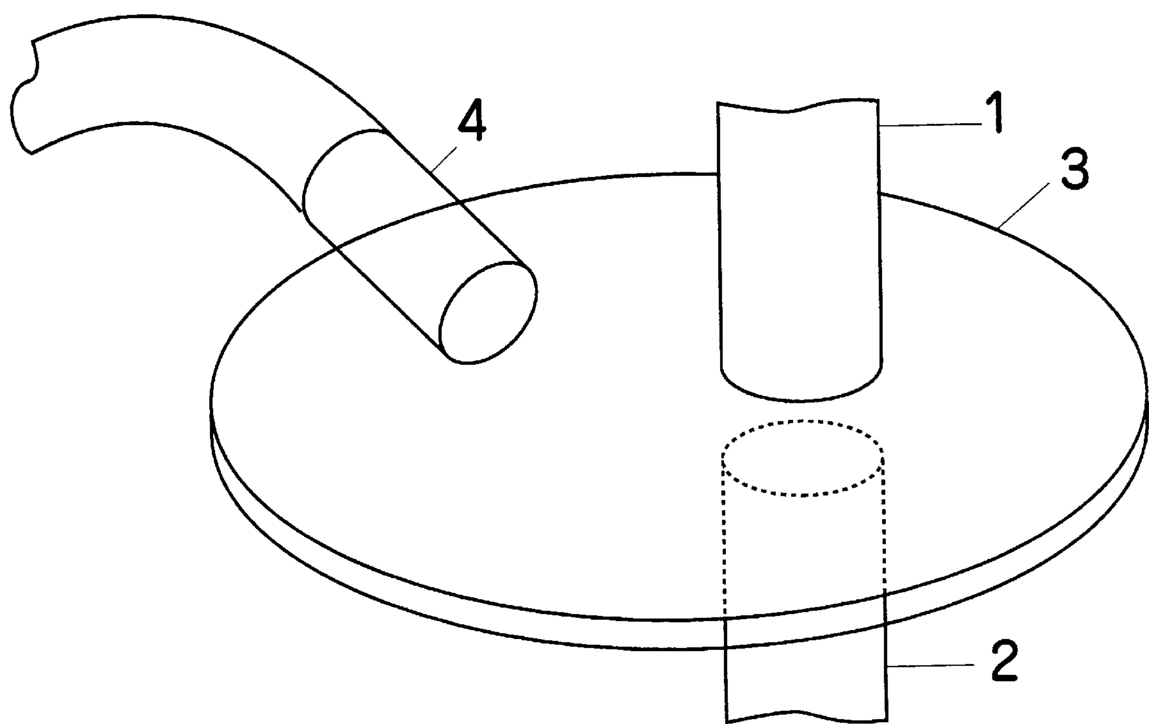
FIG. 1 is a diagram showing part of a flatness measuring apparatus according to the present invention.
Figure 2:
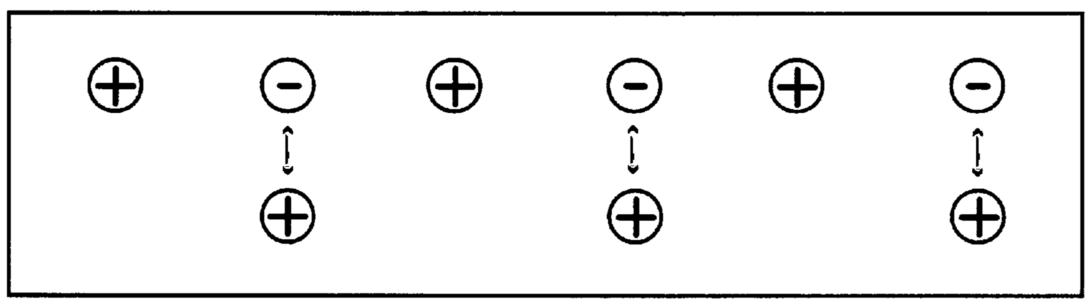
FIG. 2 is an explanatory view showing diagrammatically the presence of dopant and oxygen donors in a wafer that has not been subjected to donor-killer treatment.
Figure 3:
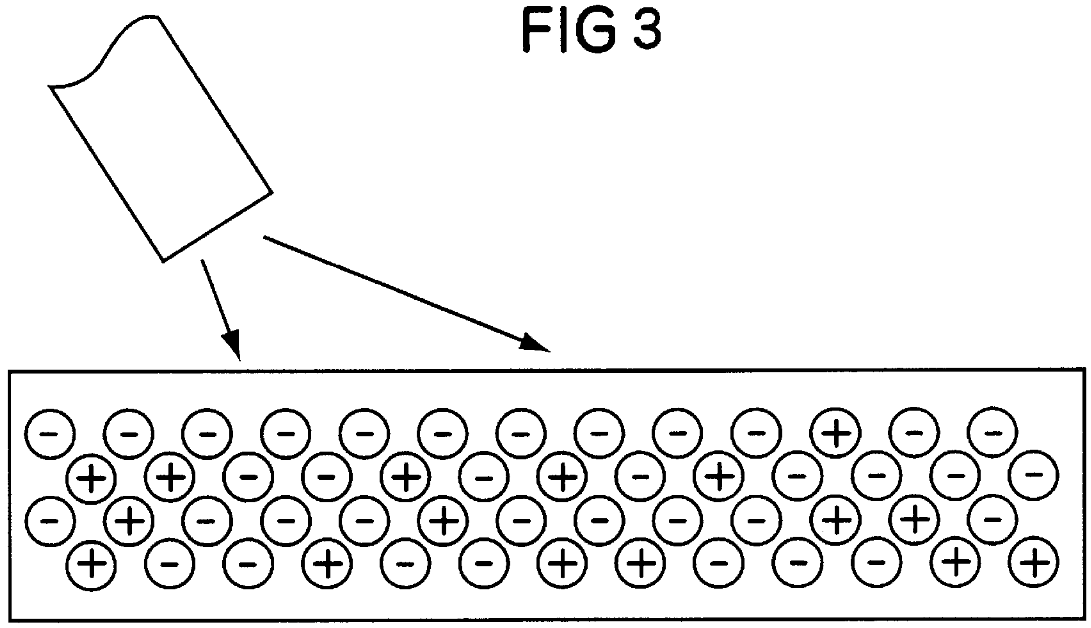
FIG. 3 is an explanatory view showing diagrammatically the state when light of prescribed wavelength is directed on to the wafer of FIG. 2.
Figure 4:
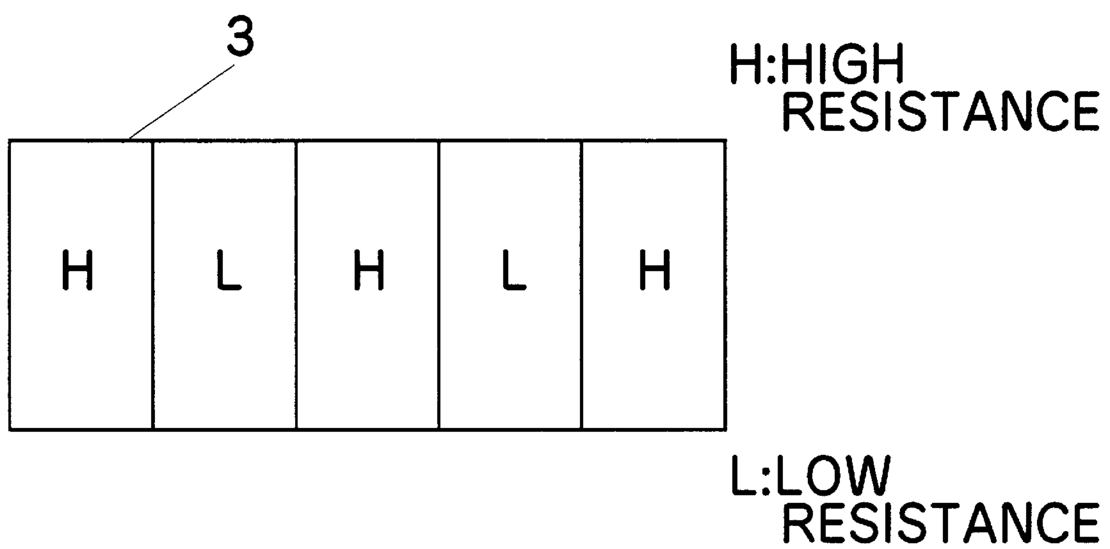
FIG. 4 is an explanatory view showing diagrammatically the presence of portions of different electrical resistance in a wafer that has not been subjected to donor-killer treatment.
Figure 5:
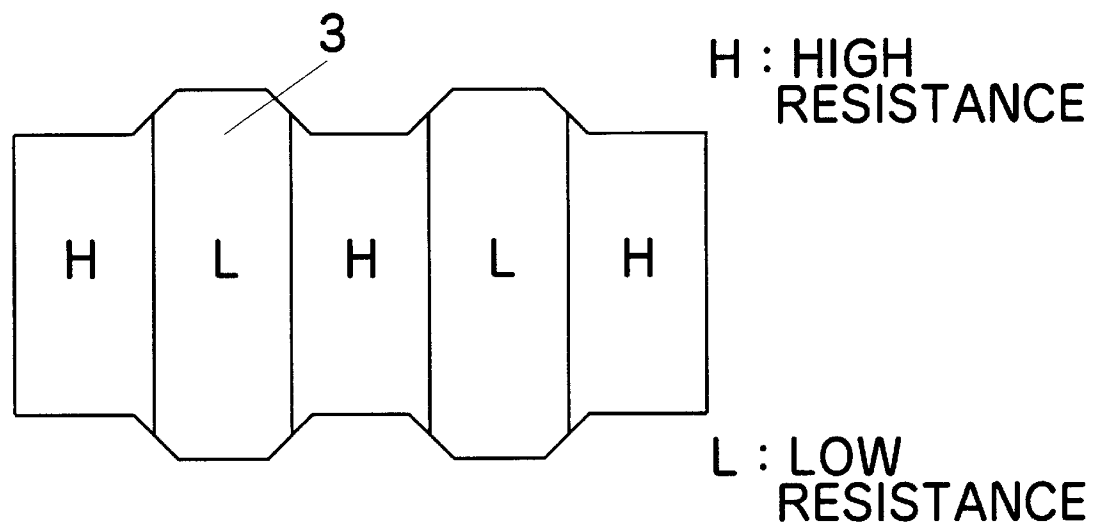
FIG. 5 is an explanatory view showing diagrammatically the state of erroneous measurement that occurs when the flatness of the wafer of FIG. 4 is measured with an electrostatic capacitative flatness measurement instrument.

Referring to FIG. 1, a flatness measuring apparatus according to an embodiment of the present invention comprises probes 1 and 2 arranged in positions facing each other on either side of a wafer 3 under measurement and a halogen lamp 4 of wavelength 1129 nm or less for irradiating the surface of wafer 3 under measurement in the vicinity of probe 1. One or two such halogen lamps 4 may be provided, and the illuminance is set to be 200,000 lux.

By using the flatness measuring apparatus of the present invention, flatness measurement was conducted again for twenty four donor-killer untreated wafers which had been rejected on account of TTV (total thickness variation) or LTV (local thickness variation) when the flatness of the wafers was measured using a conventional electrostatic capacitative flatness measuring instrument. Furthermore, the flatness of the same 24 wafers were measured by using the conventional electrostatic capacitative flatness measuring instrument after they had been subjected to donor-killer treatment. Through these flatness measurements, three groups of data were obtained and the following conclusions were obtained by comparing these three groups of data.

(1) When the donor-killer untreated wafers were measured by the conventional method using an electrostatic capacitative flatness measuring instrument, the number of rejects on account of either or both of TTV or LTV was 24.

(2) When these 24 wafers were measured again by using the flatness measurement method of the present invention, the number of rejects on account of either or both of TTV and LTV was 11, the remaining 13 wafers being good.

(3) When these 24 wafers were measured again by the conventional method after having been subjected to donor-killer heat treatment, the evaluation obtained was in complete agreement with that of (2).

These results prove that, by using the flatness measurement method of the present invention, an accurate evaluation of good/reject can be obtained that is exactly the same as if the wafers had been subjected to donor-killer heat treatment, even without subjecting the wafers to donor-killer treatment.

As described above, with the present invention, a light source of wavelength 1129 nm or less is provided in the vicinity of the probe of an electrostatic capacitative flatness measuring instrument and the surface of the wafer under measurement is illuminated with light in the amount of at least 150,000 lux. This light enters into the bulk of the material, changes into excitation energy, and converts valence electrons to conduction electrons so that a precise measurement of flatness can thereby be achieved even though the wafer has not subjected to the donor-killer treatment.

Although the above embodiment uses light energy for the excitation, the excitation may be made not only light energy, but the measurement may be performed while exciting the valence electrons using heat energy or electron beam energy, etc.

For example, if heat energy is employed, infrared radiation of wavelength 1100 nm or more may be employed. Although full excitation using heat in this way requires 200° C. or more, sufficiently accurate measurement can be achieved in a partially excited state of 180° C. or more.

By the application of the present invention, wafers of poor flatness can be picked out and discarded prior to donor-killer treatment and the good/reject evaluation of flatness can be performed on donor-killer untreated wafers. Therefore, since unnecessary heat treatment is avoided, wafer yield can be greatly improved.

What is claimed is:

1. A method of measuring the flatness of a semiconductor wafer made of a material having a band gap and in which the thickness of each part of the semiconductor wafer is measured by using an electrostatic capacitative flatness measuring instrument, and the flatness of the semiconductor wafer is measured based on the displacement of the thickness among the each part of the semiconductor wafer, wherein the measurement of the thickness of the each part of the semiconductor wafer by using the electrostatic capacitative flatness measuring instrument is performed while applying energy of more than the band gap of the material of which the semiconductor wafer is made onto a surface of the semiconductor wafer.

2. A flatness measurement apparatus for a semiconductor wafer made of a material having a band gap and in which the thickness of each part of the semiconductor wafer is measured by using an electrostatic capacitative flatness measuring instrument, and the flatness of the semiconductor wafer is measured based on the displacement of the thickness among the each part of the semiconductor wafer, wherein the flatness measurement apparatus comprises energy supplying means for supplying energy of more than the band gap of the material of which the semiconductor wafer is made onto a surface of the semiconductor wafer, and the measurement of the flatness of the semiconductor wafer is performed by using the energy supplying means and the electrostatic capacitative flatness measuring instrument.

* * * * *